(12) United States Patent
Hohlfeld

(10) Patent No.: US 11,688,712 B2
(45) Date of Patent: Jun. 27, 2023

(54) SEMICONDUCTOR ARRANGEMENT AND METHOD FOR PRODUCING THE SAME

(71) Applicant: Infineon Technologies AG, Neubiberg (DE)

(72) Inventor: Olaf Hohlfeld, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 328 days.

(21) Appl. No.: 16/792,682

(22) Filed: Feb. 17, 2020

(65) Prior Publication Data

US 2020/0266171 A1 Aug. 20, 2020

(30) Foreign Application Priority Data

Feb. 18, 2019 (EP) ..................................... 19157627

(51) Int. Cl.
*H01L 23/00* (2006.01)
*H01L 27/12* (2006.01)
(52) U.S. Cl.
CPC .......... *H01L 24/34* (2013.01); *H01L 27/1248* (2013.01); *H01L 2224/32013* (2013.01); *H01L 2224/32054* (2013.01); *H01L 2224/32055* (2013.01); *H01L 2224/32056* (2013.01); *H01L 2224/32059* (2013.01); *H01L 2224/32113* (2013.01); *H01L 2224/32258* (2013.01); *H01L 2224/49175* (2013.01)
(58) Field of Classification Search
CPC . H01L 2224/32056; H01L 2224/32059; H01L 2224/32013; H01L 2224/32113; H01L 2224/32258
See application file for complete search history.

(56) References Cited

U.S. PATENT DOCUMENTS

| 4,109,275 A | 8/1978 | Sarkary |
| 5,527,620 A | 6/1996 | Schulz-Harder |

(Continued)

FOREIGN PATENT DOCUMENTS

| CN | 103839879 A | 6/2014 |
| CN | 106298684 A | 1/2017 |

(Continued)

OTHER PUBLICATIONS

English Translation of Hiersttetter (DE 10201314739), translation made on May 4, 2022 (Year: 2022).*

(Continued)

*Primary Examiner* — Amar Movva
(74) *Attorney, Agent, or Firm* — Murphy, Bilak & Homiller, PLLC

(57) ABSTRACT

A semiconductor arrangement includes a semiconductor substrate having a dielectric insulation layer and at least a first metallization layer arranged on a first side of the dielectric insulation layer. The first metallization layer includes at least two sections, each section being separated from a neighboring section by a recess. A semiconductor body is arranged on one of the sections of the first metallization layer. At least one indentation is arranged between a first side of the semiconductor body and a closest edge of the respective section of the first metallization layer. A distance between the first side and the closest edge of the section of the first metallization layer is between 0.5 mm and 5 mm.

13 Claims, 2 Drawing Sheets

(56) References Cited

U.S. PATENT DOCUMENTS

| | | | |
|---|---|---|---|
| 6,426,154 B1 * | 7/2002 | Naba | H01L 23/13 |
| | | | 428/629 |
| 7,589,009 B1 | 9/2009 | Kar-Roy et al. | |
| 2004/0022102 A1 | 2/2004 | Liang et al. | |
| 2013/0084679 A1 * | 4/2013 | Stolze | H01L 23/3121 |
| | | | 257/E21.506 |
| 2015/0147850 A1 | 5/2015 | Stranzl et al. | |

FOREIGN PATENT DOCUMENTS

| | | |
|---|---|---|
| DE | 2753489 A1 | 6/1978 |
| DE | 4004844 C1 | 1/1991 |
| DE | 4318241 A1 | 12/1994 |
| DE | 10111185 A1 | 6/2002 |
| DE | 10337640 A1 | 3/2005 |
| DE | 102004019568 A1 | 11/2005 |
| DE | 102006045939 A1 | 4/2008 |
| DE | 102012102611 A1 | 8/2013 |
| DE | 102013102540 A1 | 8/2014 |
| DE | 102013104739 A1 | 9/2014 |
| DE | 102013105528 A1 | 12/2014 |
| DE | 102014119386 A1 | 7/2016 |
| EP | 1089334 A2 | 4/2001 |
| EP | 1061783 B1 | 11/2013 |
| EP | 3002785 A1 | 4/2016 |
| JP | H08250823 A | 9/1996 |
| JP | H1084059 A | 3/1998 |
| JP | 2009094135 A | 4/2009 |
| JP | 2015225948 A | 12/2015 |

OTHER PUBLICATIONS

Hierstetter, Fabian, et al., Espacenet English Translation of Description of DE102013104739 A1, 1-17.

* cited by examiner

SEMICONDUCTOR ARRANGEMENT AND METHOD FOR PRODUCING THE SAME

TECHNICAL FIELD

The instant disclosure relates to a semiconductor arrangement and a method for producing the same, in particular to a semiconductor arrangement for power semiconductor modules.

BACKGROUND

Power semiconductor module arrangements often include a base plate within a housing. At least one substrate is arranged on the base plate. A semiconductor arrangement including a plurality of controllable semiconductor components (e.g., two or more IGBTs in a half-bridge configuration) is usually arranged on at least one of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor components are mounted, for example, on the first metallization layer. When switching the semiconductor components on and off during the use of the power semiconductor module, heat is generated inside the power semiconductor module arrangement. Thermal cycling within the substrate, especially within the metallization layers, may result in excessive mechanical tensions in the metallization layers, especially in those regions close to edges of the metallization layers.

There is a need for an improved semiconductor arrangement, wherein the metallization layers are less affected by mechanical tensions and have an increased current carrying capacity.

SUMMARY

A semiconductor arrangement includes a semiconductor substrate comprising a dielectric insulation layer and at least a first metallization layer arranged on a first side of the dielectric insulation layer, wherein the first metallization layer comprises at least two sections, each section being separated from a neighboring section by a recess, a semiconductor body arranged on one of the sections of the first metallization layer, and at least one indentation arranged between a first side of the semiconductor body and a closest edge of the respective section of the first metallization layer, wherein a distance between the first side and the closest edge of the section of the first metallization layer is between 0.5 mm and 5 mm.

A method for producing a semiconductor arrangement includes forming a first metallization layer on a first side of a dielectric insulation layer, wherein the first metallization layer comprises at least two sections, each section being separated from a neighboring section by a recess, arranging a semiconductor body on one of the sections of the first metallization layer, and forming at least one indentation between a first side) of the semiconductor body and a closest edge of the respective section of the first metallization layer, wherein a distance between the first side and the closest edge of the section of the first metallization layer is between 0.5 mm and 5 mm.

The invention may be better understood with reference to the following drawings and the description. The components in the figures are not necessarily to scale, emphasis is instead being placed upon illustrating the principles of the invention. Moreover, in the figures, like reference numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
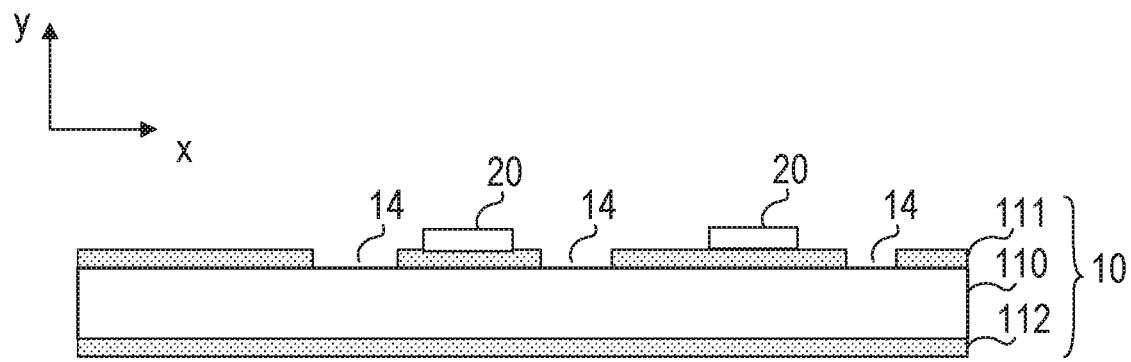
FIG. 1 illustrates a cross-sectional view of a semiconductor substrate arrangement.

FIG. 1 exemplarily illustrates a semiconductor substrate 10. The semiconductor substrate 10 includes a dielectric insulation layer 110, a first metallization layer 111 attached to the dielectric insulation layer 110, and a second metallization layer 112 attached to the dielectric insulation layer 110. The dielectric insulation layer 110 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 is a ceramic substrate, that is, a substrate in which the dielectric insulation layer 110 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 110 may consist of or include one of the following materials: $Al_2O_3$, AlN, or $Si_3N_4$. For instance, the substrate may, e.g., be a Direct Copper Bonding (DCB) substrate, a Direct Aluminium Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BrN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin. The dielectric insulation layer 110 generally comprises a high insulation resistance while, at the same time, having a low thermal conduction coefficient.

Usually one or more semiconductor bodies 20 are arranged on a semiconductor substrate 10. Each of the semiconductor bodies 20 arranged on a semiconductor substrate 10 may include a (controllable) semiconductor component such as a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable (controllable) semiconductor element. One or more controllable semiconductor components may form a semiconductor arrangement on the semiconductor substrate 10. In FIG. 1, two semiconductor bodies 20 are exemplarily illustrated. Any other number of semiconductor bodies 20, however, is also possible. According to one example, the first semiconductor body 20 comprises a semiconductor material such as Si, GaAs or SiC. The semiconductor body 20, however, may also comprise any other suitable semiconductor material.

The semiconductor substrate 10 may be attached to a base plate or heat sink (not illustrated in FIG. 1), with the second metallization layer 112 arranged between the dielectric insulation layer 110 and the base plate/heat sink 30. Only one substrate 10 may be arranged on a base plate. However, it is also possible that two or more substrates 10 are arranged on the same base plate or heat sink.

The second metallization layer 112 of the semiconductor substrate 10 in FIG. 1 is a continuous layer. The first metallization layer 111 is a structured layer in the arrangement illustrated in FIG. 1. "Structured layer" means that the first metallization layer 111 is not a continuous layer, but includes recesses 14 between different sections of the first metallization layer 111. Three recesses 14 are schematically illustrated in FIG. 1. The first metallization layer 111 in this arrangement exemplarily includes four different sections. Any other number of sections and recesses 14, however, is also possible. Different semiconductor bodies 20 may be mounted to the same or to different sections of the first metallization layer 111. Different sections of the first metallization layer 111 may have no electrical connection or may be electrically connected to one or more other sections using electrical connections such as, e.g., bonding wires. Electrical connections may also include connection plates or conductor rails, for example, to name just a few examples. This, however, is only an example. The first metallization layer 111 may comprise any number of sections. The second metallization layer 112 being a continuous layer is only an example. It is also possible that the second metallization layer 112 is a structured layer. In some applications, the second metallization layer 112 may be omitted.

One or more semiconductor bodies 20 may form a semiconductor arrangement. For example, two semiconductor bodies 20 may each comprise a switching device and may be arranged in a half-bridge configuration. Any other configurations, however, are also possible.

In many applications, space is crucial. Therefore, manufacturers constantly aim at reducing the size of power semiconductor modules. The size of the semiconductor substrate 10 and of the different sections of the first metallization layer 111 of the semiconductor substrate 10, therefore, are reduced more and more. This results in semiconductor bodies 20 that are arranged comparably close to the edges of the respective sections of the first metallization layer 111. This is exemplarily illustrated in FIGS. 2A-2B.

Figures 2A, 2B:
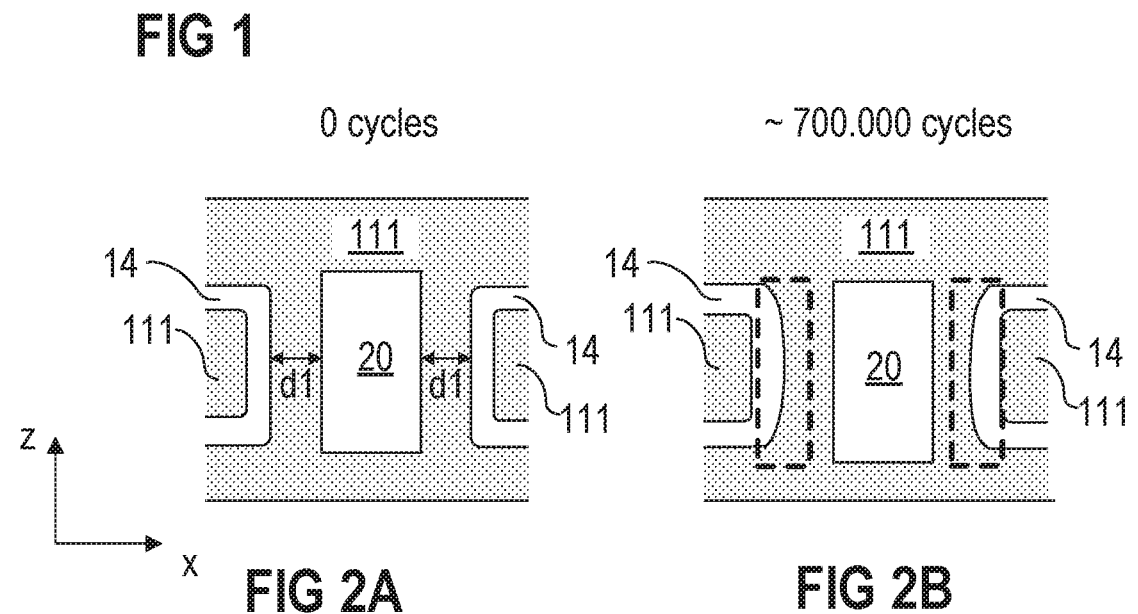
FIGS. 2A and 2B schematically illustrate a top view of a section of an exemplary semiconductor arrangement after performing 0 thermal cycles and after 700.000 thermal cycles.

FIGS. 2A-2B illustrate a top view of a semiconductor body 20 that is arranged on a section of the first metallization layer 111. In FIGS. 2A-2B, three sections of the first metallization layer 111 are schematically illustrated. Consequently, two recesses 14 are also illustrated in FIGS. 2A-2B, separating the three different sections. The semiconductor body 20 in FIGS. 2A-2B has a rectangular form. Each of the longitudinal sides (see FIG. 3B for reference) of the semiconductor body 20 is arranged at a first distance d1 from a respective one of the recesses 14 or, in other words, from a metallization edge of the respective section towards the recess 14. The first distance d1 may be between about 0.5 mm and about 5 mm, for example. As the first distance d1 is comparably small, heat that is generated by the semiconductor body 20 also spreads towards the edge of the respective section of the first metallization layer 111. During the use of the semiconductor module, the regions of the first metallization layer 111 between the semiconductor body 20 and the recesses 14 are often heated when the semiconductor body 20 is in an on-state, subsequently cooling down again when the semiconductor body 20 is in an off-state (thermal cycling).

FIG. 2A schematically illustrates the semiconductor body 20 after manufacturing. No thermal cycling has yet been performed, that is, the semiconductor body 20 has not yet been switched on and off and has not heated up and subsequently cooled down yet. The metallization edges of the different sections of the first metallization layer 111 therefore, are still sharp and clean. However, as is schematically illustrated in FIG. 2B, after a plurality of thermal cycles (e.g., 700.000 cycles) a delamination of the metallization layer 111 may occur. A delamination of the metallization edges that are arranged close to the semiconductor body 20 is clearly visible in FIG. 2B (region of interest indicated in dashed lines in FIG. 2B). The delamination may lead to an increase of the width of a recess 14 and to a decrease of the distance d1 between the metallization edge and the semiconductor body 20. The delamination may further lead to an erratic behavior or even the failure of the semiconductor arrangement.

Figures 3A, 3B:
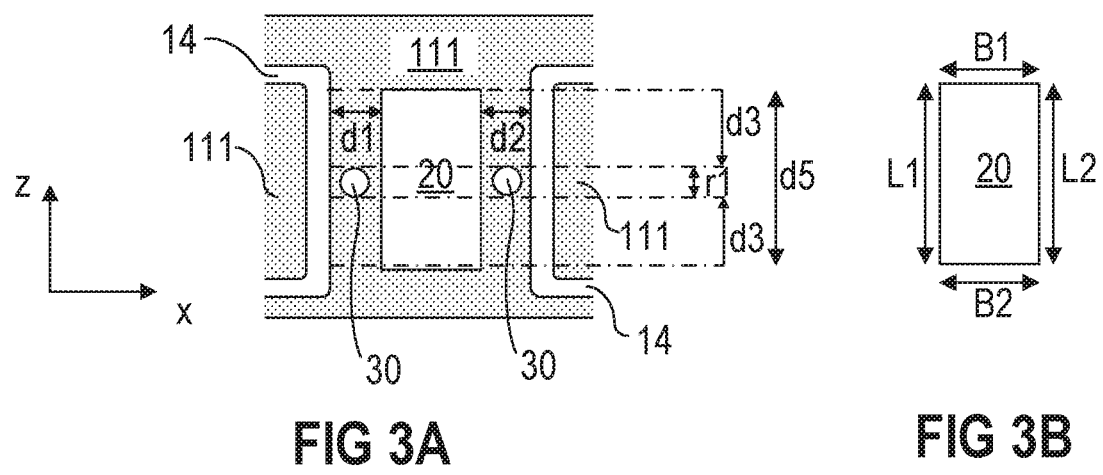
FIGS. 3A and 3B schematically illustrate a top view of a section of an exemplary semiconductor arrangement and a top view of a semiconductor body.

The semiconductor arrangement exemplarily illustrated in FIGS. 3A-3B, therefore, comprises recesses 30 that are arranged between the semiconductor body 20 and close edges of the first metallization layer 111. The semiconductor body 20 may have a rectangular or square cross-section and comprise a first longitudinal side L1, a second longitudinal side L2, a first narrow side B1, and a second narrow side B2 (see, e.g., FIG. 3B). In a square shaped semiconductor body the length of the longitudinal sides L1, L2 may correspond to the length of the narrow sides B1, B2. In the example illustrated in FIG. 3A, the first longitudinal side L1 and the second longitudinal side L2 are each arranged at a certain distance d1, d2 from the closest edge of the first metallization layer 111. This distance d1, d2 may be between 0.5 mm and 5 mm, for example. A distance d1 between the first longitudinal side L1 and an edge of the first metallization layer 111 and a distance d2 between the second longitudinal side L2 and an edge of the first metallization layer 111 may be equal or may differ from each other.

In the example illustrated in FIG. 3A, a first and a second longitudinal side L1, L2 of the semiconductor body 20 are each arranged close to an edge of the first metallization layer 111. This, however, is only an example. Generally, it is also possible that only one or none of the longitudinal sides L1, L2 is arranged close to an edge of the first metallization layer 111, and that, additionally or alternatively, the first narrow side B1 and/or the second narrow side B2 are arranged close to an edge of the first metallization layer 111. Close to an edge of the first metallization layer 111 in this context refers to a distance d1, d2 of 5 mm or less.

In order to reduce the likelihood or delamination and to increase a current carrying capacity of the arrangement, an indentation or recess 30 of the first metallization layer 111 is arranged between the semiconductor body 20 and at least one of the close edges of the first metallization layer 111. In the example illustrated in FIG. 3A, one indentation 30 is arranged between the first longitudinal side L1 and the closest recess 14, and one indentation 30 is arranged between the second longitudinal side L2 and the closest recess 14, respectively. Arranging one indentation between one side L1, L2, B1, B2 of the semiconductor body 20 and a close metallization edge may be sufficient to reduce any mechanical tension or stress in the surrounding region of the first metallization layer 111, thereby increasing the current carrying capacity of the power semiconductor module arrangement.

Such an indentation 30 may have a rounded cross-section, as is exemplarily illustrated in FIG. 3A. However, the indentation 30 may also have any other shape such as an oval shape, a rectangular shape, a square shape, a diamond shape, or a rhombic shape, for example. An indentation 30 having a rectangular or slit-shaped cross-section is exemplarily illustrated in FIG. 4. FIG. 5 schematically illustrated an arrangement wherein a plurality of indentations 30 is arranged in one row between each of the first longitudinal side L1 and the second longitudinal side L2 of the semiconductor body 20 and the respective closest metallization edge towards a recess 14.

Generally speaking, one or more indentations 30 may be formed between one side L1, L2, B1, B2 of the semiconductor body 20 and a close metallization edge towards a recess 14. Each of the one or more indentations 30 may have a round shape, an oval shape, a rectangular shape, a square shape, a diamond shape, a rhombic shape, or any other suitable shape, for example.

Figure 6:
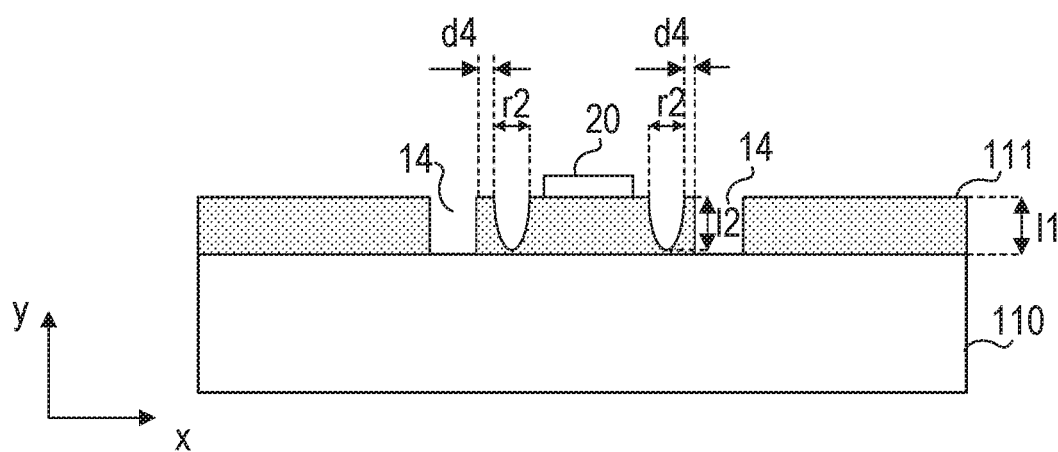
FIG. 6 schematically illustrates a cross-sectional view of an exemplary semiconductor arrangement.

Each of the at least one indentation 30 may have a diameter r2 of between 300 μm and 1000 μm, or between 550 μm and 650 μm in a first horizontal direction x, for example. If the indentation 30 has a different shape than a rounded shape, the diameter r2 may refer to the largest extension of the indentation 30 in the first direction x, the first direction x being perpendicular to the respective side L1, L2, B1, B2 of the semiconductor body 20 and the respective metallization edge, as is schematically illustrated in FIG. 6.

The first metallization layer 111 may have a first thickness l1. Each of the at least one indentation 30 may have a maximum depth l2 in a vertical direction y, wherein the maximum depth l2 of the at least one indentation 30 is between 60% and 100% of the first thickness l1 of the first metallization layer 111. The first thickness l1 of the first metallization layer 111 may be between 100 μm and 500 μm, for example. Any other suitable thicknesses l1 are also possible. A distance d4 between the at least one indentation 30 and the closest metallization edge or recess 14 may be between 0 and 3 mm, for example. This distance d4 may depend on the distance d1, d2 between the semiconductor body 20 and the respective recess 14 and the diameter r2 of the indentation 30, for example.

According to one example, the at least one indentation 30 in the first direction x is arranged centrally between the semiconductor body 20 and the closest metallization edge towards a respective recess 14. That is, a distance between the indentation 30 and the semiconductor body 20 equals a distance between the indentation 30 and the metallization edge. However, it is also possible that an indentation 30 is arranged closer to the semiconductor body 20 than to the closest metallization edge, or vice versa. In the first direction x, there may not be any indentations 30 arranged next to each other. That is, a vertical line extending from an arbitrary point on the edge of the semiconductor body 20 towards the closest recess 14 does not cross more than one indentation 30.

Figure 4:
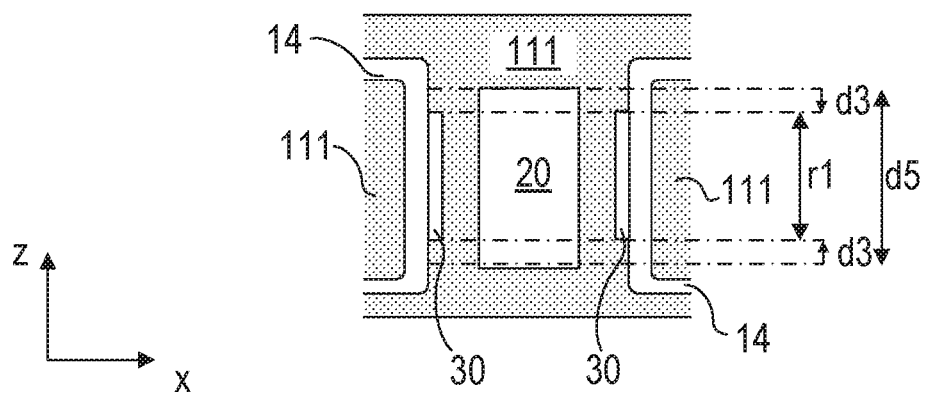
FIG. 4 schematically illustrates a top view of an exemplary semiconductor arrangement.
Figure 5:
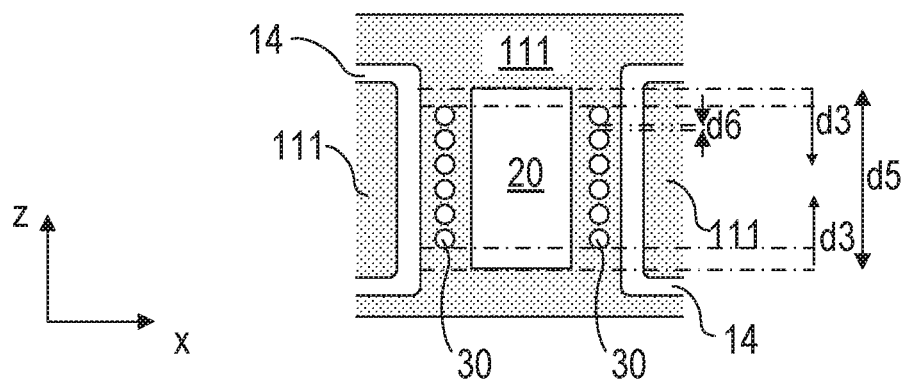
FIG. 5 schematically illustrates a top view of an exemplary semiconductor arrangement.

An elongated indentation 30, as is exemplarily illustrated in FIG. 4, may extend in parallel to a respective side L1, L2, B1, B2 of the semiconductor body 20. A longest extension r1 of an elongated indentation 30 along a second axis z may correspond to an extension d5 of the semiconductor body 20 along the second axis z, wherein the second axis z extends perpendicular to the first axis x and in parallel to the respective side L1, L2 of the semiconductor body 20. However, according to one example, the longest extension r1 of an indentation 30 along the second axis z may be less than an extension d5 of the semiconductor body 20 along the second axis z.

As is illustrated in FIGS. 3A and 4, a furthest edge of the indentation 30 in the second direction z may be indented with respect to a furthest edge of the semiconductor body 20 in the second direction z by a distance d3. This distance d3 may be between 10% and 30% of the total length d5 of the semiconductor body 20 in the second direction z, for example. The indentation 30 being indented with respect to the furthest edge of the semiconductor body 20 may help to further increase the current carrying capacity of the power semiconductor module arrangement. The indentation 30 may be indented with respect to the furthest edge of the semiconductor body 20, for example, if the current carrying capacity of the power semiconductor module arrangement is critical.

An indentation 30 may be arranged centrally along the respective side of the semiconductor body 20, for example, as is schematically illustrated in FIGS. 3A and 4. That is, the distance d3 towards one edge of the semiconductor body 20 (e.g., edge of first narrow side B1) may be equal to the distance d3 towards another edge of the semiconductor body 20 (e.g., edge of second narrow side B2).

The same applies for a plurality of indentations 30, as is illustrated in FIG. 5. The plurality of indentations 30 may form a row of indentations 30, wherein the row of indentations 30 extends in parallel to the respective side L1, L2 of the semiconductor body 20 and is indented with respect to the furthest edge of the semiconductor body 20 in the second direction z by a distance d3. Also for a row of indentations 30, this distance d3 may be between 10% and 30% of the total length d5 of the semiconductor body 20 in the second direction z. A row of indentations 30 extending in a second direction z in parallel to one side of the semiconductor body 20 may not extend beyond the furthest edge of the semiconductor body 20 in the second direction z. A distance d6 between two neighboring indentations 30 may be at least 50 μm, for example.

Similar to a single indentation 30, a row of indentations 30 may also be arranged centrally along the respective side of the semiconductor body 20, for example, as is schematically illustrated in FIG. 5. That is, the distance d3 towards one edge of the semiconductor body 20 (e.g., edge of first narrow side B1) may be equal to the distance d3 towards another edge of the semiconductor body 20 (e.g., edge of second narrow side B2).

The at least one indentation 30 may be formed by a suitable etching process or by mechanically reducing the thickness 11 of the first metallization layer 111, for example. Mechanically reducing the thickness 11 of the first metallization layer 111 to form at least one indentation 30 may comprise a stamping or imprinting process, for example.

In the examples illustrated in FIGS. 3A to 5, indentations 30 are arranged along two sides L1, L2 of the semiconductor body 20. This, however, is only an example. In some applications, it may be sufficient to arrange at least one indentation 30 along only one side L1, L2, B1, B2 of the semiconductor body 20. This one side may be either a longitudinal side L1, L2 or a narrow side B1, B2 of the semiconductor body 20 that is arranged close to a metallization edge. In particular, the respective side L1, L2, B1, B2 may be arranged at a distance d1, d2 from a metallization edge which is 5 mm or less. It is also possible to arrange at least one indentation 30 along either two or three sides L1, L2, B1, B2 of the semiconductor body 20. Usually, however, indentations 30 are not arranged on more than three sides L1, L2, B1, B2 of the semiconductor body 20.

A method for producing a semiconductor arrangement includes forming a first metallization layer 111 on a first side of a dielectric insulation layer 110, wherein the first metallization layer 111 comprises at least two sections, each section being separated from a neighboring section by a recess 14. The method further includes arranging a semiconductor body 20 on one of the sections of the first metallization layer 111, and forming at least one indentation 30 between a first side L1, L2, B1, B2 of the semiconductor body 20 and a closest edge of the respective section of the first metallization layer 111, wherein a distance d1, d2 between the first side L1, L2, B1, B2 and the closest edge of the section of the first metallization layer 111 is between 0.5 mm and 5 mm. The at least one indentation 30 may be formed at the same time as the at least one recess 14 between the at least two sections of the first metallization layer 111. Forming the at least one indentation may include one of an etching process, a stamping, or an imprinting process, for example.

The at least one recess 14 may be formed by means of an etching process, for example. For example, a continuous first metallization layer 111 may be formed on the dielectric insulation layer 110 and may subsequently be structured during an etching process. The at least one indentation 30 may be formed during such an etching process at the same time as the at least one recess 14. However, it is also possible that the at least one indentation 30 is formed in a separate process before or after forming the at least one recess 14. For example, the at least one recess 14 may be formed during an etching process, and subsequently the at least one indentation 30 may be formed during a further etching process or during a stamping or an imprinting process. For example, the at least one indentation 30 may be formed during a separate etching process if a depth 12 of the at least one indentation 30 is less than a thickness 11 of the first metallization layer 111.

In the Figures, only elements that are necessary for the understanding of the invention are illustrated. The arrangements according to the examples described above, however, may further include additional elements such as additional conductor tracks or additional semiconductor devices, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A semiconductor arrangement, comprising:
   a semiconductor substrate comprising a dielectric insulation layer and a first metallization layer arranged on a first side of the dielectric insulation layer, the first metallization layer comprising at least two sections, each section being separated from a neighboring section by a recess;
   a semiconductor body arranged on one of the sections of the first metallization layer; and
   at least one indentation arranged between a first side of the semiconductor body and a closest edge of the respective section of the first metallization layer,
   wherein a distance between the first side and the closest edge of the section of the first metallization layer is between 0.5 mm and 5 mm,
   wherein the at least one indentation is indented with respect to a furthest edge of the semiconductor body in a second direction such that no indentation extends beyond the furthest edge of the semiconductor body in the second direction.

2. The semiconductor arrangement of claim 1, further comprising:
   at least one indentation arranged between a second side of the semiconductor body and a closest edge of the respective section of the first metallization layer,
   wherein a distance between the second side and the closest edge of the section of the first metallization layer is between 0.5 mm and 5 mm.

3. The semiconductor arrangement of claim 2, further comprising:
   at least one indentation arranged between a third side of the semiconductor body and a closest edge of the respective section of the first metallization layer,
   wherein a distance between the third side and the closest edge of the section of the first metallization layer is between 0.5 mm and 5 mm.

4. The semiconductor arrangement of claim 1, wherein a cross-section of each of the at least one indentation has a round shape, an oval shape, a rectangular shape, a square shape, a diamond shape, or a rhombic shape.

5. The semiconductor arrangement of claim 1, wherein a largest extension of each of the at least one indentation in a first direction is between 300 µm and 1000 µm, and wherein the first direction is perpendicular to the respective side of the semiconductor body and the closest edge of the respective section of the first metallization layer.

6. The semiconductor arrangement of claim 1, wherein a depth of each of the at least one indentation is between 60% and 100% of a thickness of the first metallization layer.

7. The semiconductor arrangement of claim 1, wherein a distance between each of the at least one indentation and the respective edge of the section of the first metallization layer is between 0 and 3 mm.

8. The semiconductor arrangement of claim 1, wherein the semiconductor arrangement comprises a plurality of indentations between the first side of the semiconductor body and the closest edge of the respective section of the first metallization layer, and wherein the plurality of indentations is arranged in one row between the first side of the semiconductor body and the closest edge of the respective section of the first metallization layer.

9. The semiconductor arrangement of claim 8, wherein the row of indentations extends in parallel to the respective side of the semiconductor body.

10. The semiconductor arrangement of claim 8, wherein a distance between two neighboring indentations in the row of indentations is at least 50 µm.

11. The semiconductor arrangement of claim 8, wherein the row of indentations is indented with respect to the furthest edge of the semiconductor body in the second direction such that a distance between the row of indentations and the furthest edge of the semiconductor body in the second direction is between 10% and 30% of a maximum length of the semiconductor body in the second direction.

12. The semiconductor arrangement of claim 1, wherein the semiconductor body comprises an IGBT, a MOSFET, a JFET, a HEMT or a diode.

13. The semiconductor arrangement of claim 1, wherein a distance between the at least one indentation and the furthest edge of the semiconductor body in the second direction is between 10% and 30% of a maximum length of the semiconductor body in the second direction.

\* \* \* \* \*